(12) United States Patent
Okaji

(10) Patent No.: US 8,404,433 B2
(45) Date of Patent: Mar. 26, 2013

(54) METHOD FOR FORMING RESIST PATTERN AND METHOD FOR MANUFACTURING SEMICONDUCTOR DEVICE

(75) Inventor: Shigeharu Okaji, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 332 days.

(21) Appl. No.: 12/662,199

(22) Filed: Apr. 5, 2010

(65) Prior Publication Data

US 2010/0255421 A1    Oct. 7, 2010

(30) Foreign Application Priority Data

Apr. 7, 2009   (JP) ................................ 2009-092940

(51) Int. Cl.
G03F 7/26        (2006.01)
(52) U.S. Cl. ........................................ 430/322; 430/330
(58) Field of Classification Search .................. 430/322, 430/330
See application file for complete search history.

(56) References Cited

U.S. PATENT DOCUMENTS 4,201,580 A * 5/1980 Feit ............................... 430/319

2006/0110687 A1  5/2006 Kawano et al.
2009/0246710 A1  10/2009 Kawano et al.

FOREIGN PATENT DOCUMENTS

| JP | 10-172889 | | 6/1998 |
| JP | 2005-136430 | * | 5/2005 |
| JP | 2006-135080 | | 5/2006 |

OTHER PUBLICATIONS

Machine translation of JP 2005-136430.*

* cited by examiner

Primary Examiner — Kathleen Duda
(74) Attorney, Agent, or Firm — McGinn IP Law Group, PLLC

(57) ABSTRACT

In order to suppress variation of a resist pattern size caused by a temperature unevenness at a prebaking process, applying a resist of a positive type or a negative type on a base substrate, prebaking, exposing, post-exposure baking, and forming the resist to be a predetermined shape by developing the resist are carried out. The prebaking is carried out at a temperature equal to or more than a detachment starting temperature of a protective group of a base resin included in the resist in a case where the resist is the positive type. In a case where the resist is the negative type, the prebaking is carried out at a temperature equal to or more than a cross-linking starting temperature of a cross-linker in a base resin included in the resist.

20 Claims, 5 Drawing Sheets

METHOD FOR FORMING RESIST PATTERN AND METHOD FOR MANUFACTURING SEMICONDUCTOR DEVICE

INCORPORATION BY REFERENCE

This patent application claims a priority on convention based on Japanese Patent Application No. 2009-092940. The disclosure thereof is incorporated herein by reference.

BACKGROUND OF THE INVENTION

1. Field of the Invention

The present invention relates to a method for forming a resist pattern and a method for manufacturing a semiconductor device.

2. Description of Related Art

To satisfy a demand for improvement of integration degree, a main stream of a light source used in an exposure process in the photolithography shifts from a mercury lamp for irradiating an i-ray to a KrF excimer laser, improvement of sensitivity of a resist is advanced in order to respond decrease in exposure intensity on a wafer surface during the exposure, and a resist of a chemical amplification type has been often used.

The resist of the chemical amplification type includes a base resin and a PAG (Photo Acid Generator), and a resist of a negative type further includes a cross-linker. A hydrogen ion (acid) is generated from the PAG with exposure energy at the exposure process. In a Post Exposure Bake process after the exposure (hereinafter referred to as a PEB process), the hydrogen ion attacks a protective group in a base resin to cause a deprotection reaction in a case where the resist is a positive type (in a case of a positive resist), and the hydrogen ion acts on the cross-linker to cause a cross-linking reaction of the base resin in a case where the resist is the negative type (in a case of a negative resist). In both cases, the hydrogen ion is newly generated in the PEB process, the new hydrogen ion causes a next deprotection reaction or cross-linking reaction, and thereby sensitivity of the resist is improved.

As shown in FIG. 5, in a general photolithography process using the resist of the chemical amplification type, the resist is firstly applied on a wafer (a resist application process, step S101), and the resist is baked after the application, for example, at 80 to 135° C. (a prebaking process, step S102). Moreover, after that, the exposure process (step S103), the FEB process (step S104), and a development process (step S105) are carried out in this order to form the resist in a predetermined pattern shape.

Here, as shown in FIG. 2, in the prebaking process at step S102, a plurality of ceramic balls 2 are provided on a hot plate 1 of a prebaking machine (not entirely illustrated), and the wafer 3 is heated in a state where the wafer 3 is placed on the ceramic balls 2.

However, since the wafer 3 is warped in the heating, baking temperatures sometimes vary between a central portion and a circumferential portion on the wafer 3. The warping of the wafer 3 and difference of the baking temperatures caused by the warping become prominent in a case where the wafer 3 is extremely thin or in a case where a metal film, whose linear expansion coefficient is considerably different from that of Si, is formed only on one surface of the wafer 3.

When the baking temperature varies between the central portion and the circumferential portion, sensitivity of the resist (Eth) varies between the central portion and the circumferential portion. For this reason, when a whole surface of the wafer 3 is exposed by an even exposure amount, a pattern size of the resist varies between the central portion and the circumferential portion. Meanwhile, the sensitivity (Eth) is represented by minimum exposure energy (mJ/cm$^2$) at which a remainder of the resist film is not produced (a rate of remaining film becomes 0%) in a case where the development is carried out under a fixed condition.

As described above, in the prebaking process, there is a case where the heating temperature becomes uneven on the surface of the wafer 3 by the warping, and thereby the pattern size of the resist varies on the surface of the wafer 3. In addition, the same phenomenon occurs also in the PEB process.

Document 1 (Japanese patent publication JP-2006-135080A) discloses a technique for not carrying out the exposure on the whole surface of the wafer at an even exposure amount but carrying out the exposure by adjusting the exposure amount for each of a plurality of regions on the wafer surface. Specifically, the exposure amount is adequately adjusted on the surface of the wafer by changing the exposure amount for each exposing shot. In this manner, the variation in the pattern size is suppressed, which is attributed to the temperature unevenness caused by the warping in the PEB process (so-called a variable exposure technique). Also in document 2 (Japanese patent publication JP-A-Heisei 10-172889), a technique similar to that of document 1 is disclosed.

SUMMARY OF THE INVENTION

However, according to the techniques described in documents 1 and 2, in a range exposed by one shot by a stepper, the exposure amount is still even. For this reason, as described above, in this range, the pattern size of the resist varies on the surface of the wafer because of the temperature unevenness.

Additionally, in the techniques described in documents 1 and 2, since the exposure amount drastically changes on a boundary between one range exposed by one shot and the other range adjacent to the range, there is a problem that the size of the resist pattern also drastically changes on the boundary.

As mentioned above, in the techniques described in documents 1 and 2, an effect for suppressing the variation of the pattern size is not sufficient.

Meanwhile, generally, the temperature at the prebaking is set to be less than a detachment starting temperature of the protective group in the base resin included in the resist (for example, less than 135° C. as described above) or less than a cross-linking starting temperature of the cross-linker in the base resin included in the resist. Considering that the prebaking is generally carried out so as not to cause the detachment reaction of the protection group or the cross-linking reaction of the cross-linker, this stands to reason.

A method for forming a resist pattern according to the present invention includes: applying a chemically-amplified resist of a positive type or a negative type on a base substrate, prebaking the resist after the applying, exposing the resist after the prebaking, baking the resist after the exposing; and forming the resist to be a predetermined shape by developing the resist after the baking. The prebaking includes, prebaking at a temperature equal to or more than a detachment starting temperature of a protective group in a base resin included in the resist in a case where the resist is the positive type, and prebaking at a temperature equal to or more than a cross-linking starting temperature of a cross-linker in a base resin included in the resist in a case where the resist is the negative type.

According to characteristics of the resist, at a temperature equal to or more than a specific temperature, the detaching reaction of the protective group in the base resin or the cross-linking reaction is promoted. By using this, in the present invention, improvement of a sensitivity of the resist is tried without generation of a hydrogen ion from PAG by the exposure, by promoting the detaching reaction or the cross-linking reaction which is fundamentally promoted in the PEB process. At this time, since the sensitivity is exceedingly improved at a portion having a low sensitivity, a difference of the sensitivity of the resist becomes small on a surface of the base substrate.

That is, according to the present invention, since exposure is carried out after suppressing in-plane variation in the sensitivity of the resist by prebaking at a temperature equal to or more than the detachment starting temperature or the cross-linking starting temperature; in-plane variation in the size of the resist pattern is suppressed, which is attributed to temperature unevenness at prebaking.

Also, a method for manufacturing a semiconductor device according to the present invention includes, forming a resist pattern on a semiconductor wafer, and shaping the semiconductor wafer by using the resist pattern as a mask. The forming includes the method for forming a resist pattern.

According to the present invention, it can be suppressed that the pattern size of the resist varies on the surface due to the temperature unevenness in the prebaking.

DESCRIPTION OF THE PREFERRED EMBODIMENTS

Referring to drawings, embodiments of the present invention will be explained below. In all drawings, the same numeral is added to the same component, and thus the explanation is arbitrarily omitted.

First Embodiment

Figure 1:
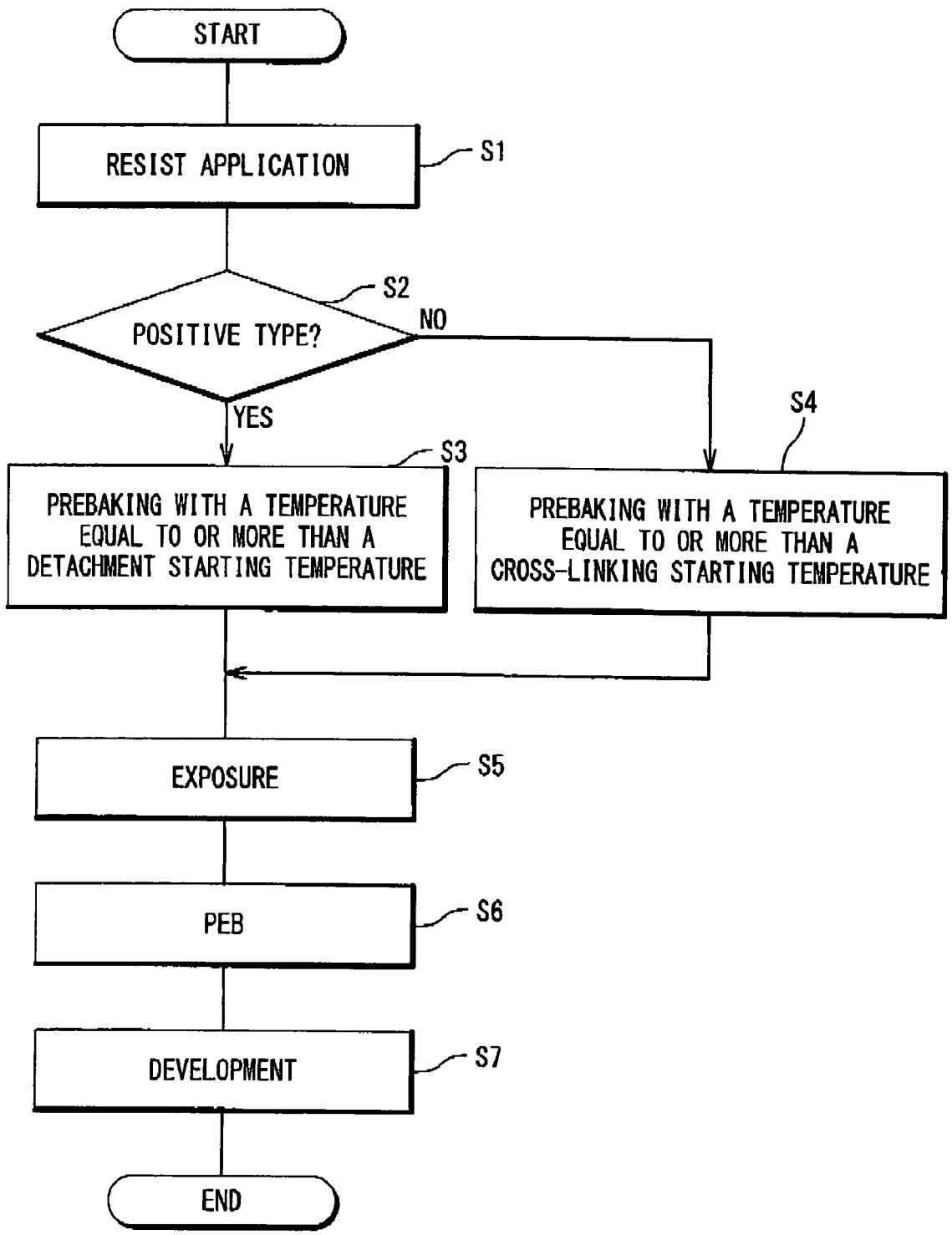
FIG. 1 is a flowchart showing a flow of a resist pattern forming method according to an embodiment.
Figure 2:
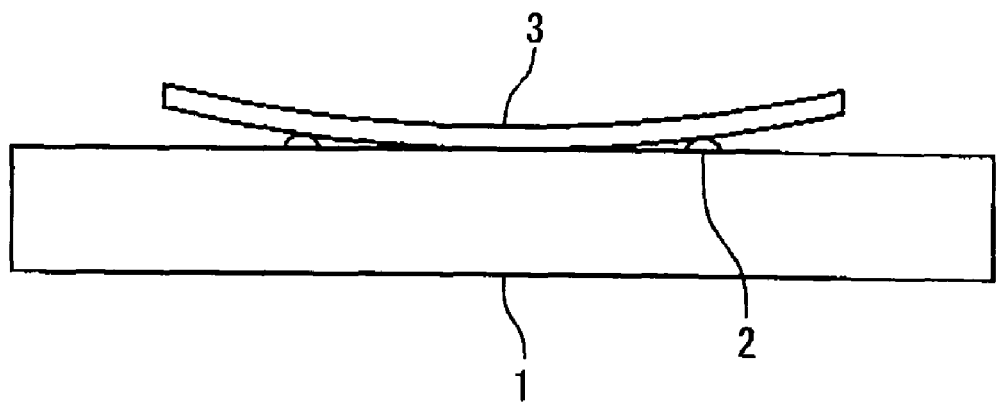
FIG. 2 is a schematic front cross-section view showing a prebaking process.
Figure 3:
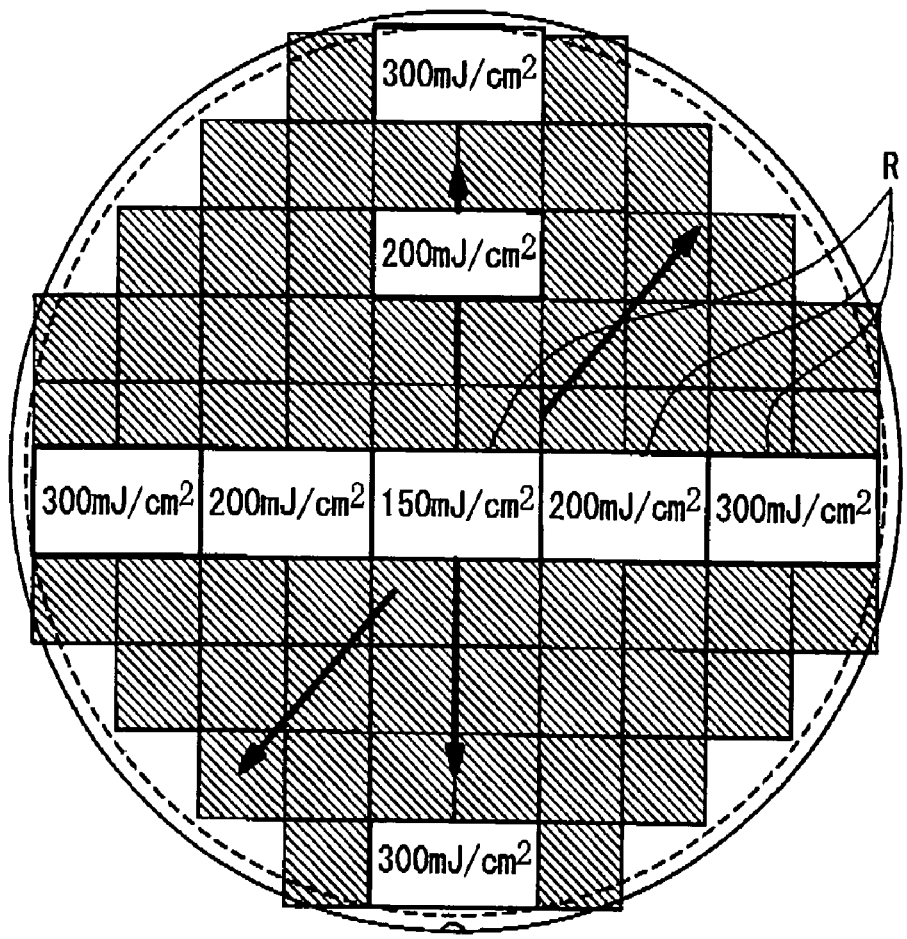
FIG. 3 is a plane view showing a distribution of exposure energy in a surface of a wafer in an exposure process.

FIG. 1 is a flowchart showing a method for forming a resist pattern according to a first embodiment, and FIG. 2 is a front cross-section view schematically showing a prebaking process included in the method for forming the resist pattern according to the first embodiment. FIG. 3 is a drawing explaining an exposure process included in the resist pattern forming method according to the first embodiment, and is a plane view showing a distribution of exposure energy on a surface of a wafer 3.

In the method for forming the resist pattern according to the present embodiment, a resist application process (step S1) for applying a resist of a positive type or a negative type on a base substrate (for example, a semiconductor wafer 3), a prebaking process (steps S3 and S4) for prebaking the resist, an exposure process (step S5) for exposing the resist, a post exposure bake (PEB) process (step S6) for carrying out post exposure bake to the resist, and a development process (step S7) for forming the resist in a predetermined pattern shape by developing the resist are carried out in this order. In the prebaking process (steps S3 and S4), the prebaking is carried out under a condition of a temperature equal to or more than a detachment starting temperature of the protective group in a base resin included in the resist in a case where the resist is the positive type (step S3), and the prebaking is carried out under a condition of a temperature equal to or more than a cross-linking starting temperature of a cross-linker in the base resin included in the resist in a case where the resist is the negative type (step S4). Additionally, a method for manufacturing a semiconductor device according to the present embodiment includes, a resist pattern forming process for forming a resist pattern on the semiconductor wafer 3, and a process for processing the semiconductor wafer 3 using the resist pattern as a mask. The resist pattern forming process in the method for manufacturing a semiconductor device according to the present embodiment is carried out by the method for forming the resist pattern according to the present embodiment. Details will be explained below.

First of all, the method for forming the resist pattern according to the present embodiment will be explained.

Figure 5:
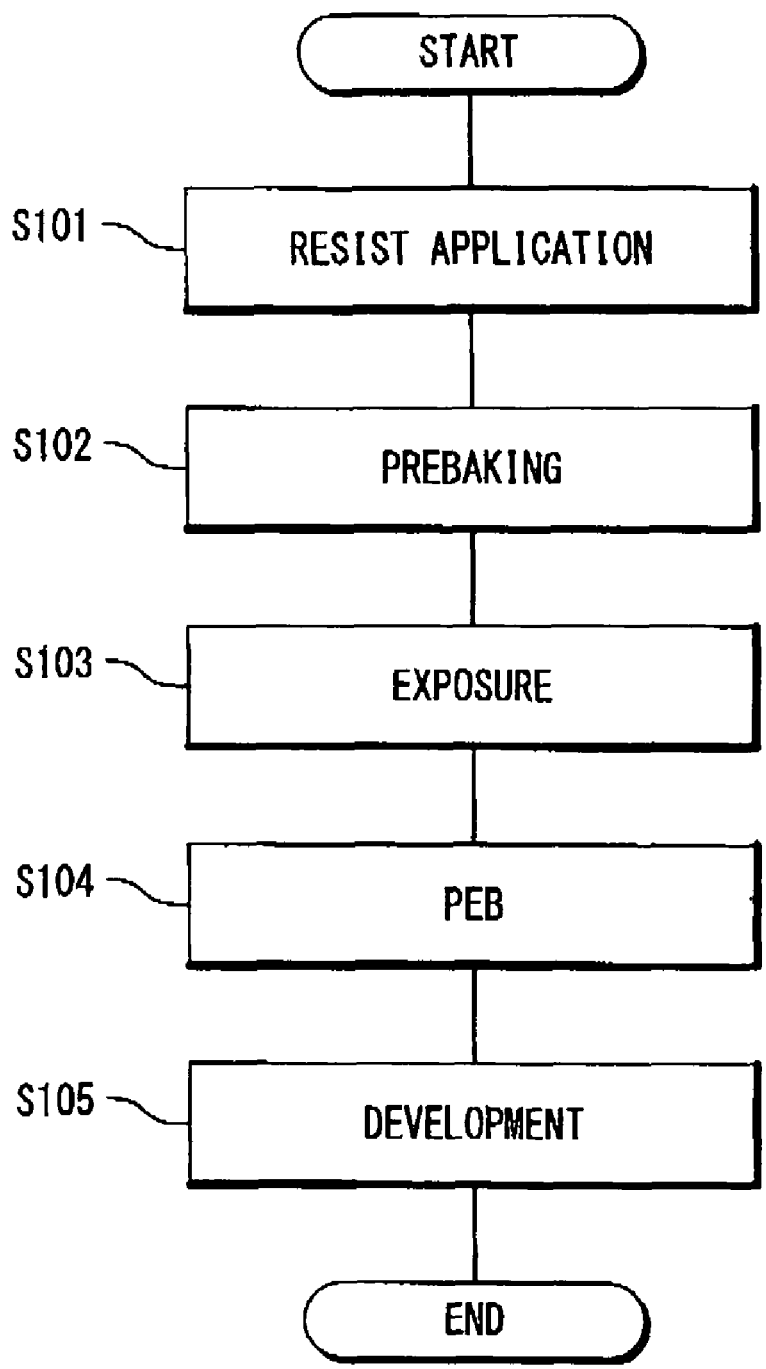
FIG. 5 is a flow chart showing a flow of a typical resist pattern forming method.

The method for forming resist pattern according to the present embodiment is carried out in the same process flow as the typical photolithography process explained by FIG. 5. However, as described below in detail, the prebaking temperature in the prebaking process (steps S3 and S4) is different from the typical photolithography process.

Firstly, the resist of a chemical amplification type is applied on a semiconductor wafer (hereinafter simply referred to as the wafer) 3 (a resist application process, step S1).

Next, the resist is baked by carrying out the prebaking process (step S3 or S4). That is, as shown in FIG. 2, for example, the wafer 3 is arranged on ceramic balls 2 provided on a hot plate 1 (a heat source), and the wafer 3 is heated by the hot plate 1.

Here, the warping of the wafer 3 in the prebaking is formed in a downwardly-convex shape shown in FIG. 2 or in an upwardly-convex shape not shown in the drawing. In the first embodiment, a case where the warping of the wafer 3 is the downwardly-convex shape as shown in FIG. 2 will be explained.

In a case where the resist is the positive type (the positive resist) (Yes at step S2), the temperature of the prebaking process (hereinafter referred to as the prebaking temperature) is set to be equal to or more than the detachment starting temperature of the protective group in the base resin included in the resist (step S3). For example, in a case where the detachment starting temperature is 140° C., the prebaking temperature is set to be 140° C. or more. Moreover, it is preferable that the prebaking temperature is set to the detachment starting temperature +30° C. or less, and is more preferable that the prebaking temperature is set to the detachment starting temperature +15° C. or less. That is, in a case where the detachment starting temperature is 140° C., it is preferable that the prebaking temperature is set to 170° C. or less, and is more preferable that the prebaking temperature is set to 155° C. or less. When the prebaking is carried out at these upper limit temperatures or less, development failure can be suppressed.

Additionally, in the case where the resist applied at the above-described step S1 is the negative type (the negative resist) (No at step S2), the prebaking temperature is set to the cross-linking starting temperature of the cross-linker in the base resin included in the resist or more (step S4). For example, in a case where the cross-linking starting temperature is 140° C., the prebaking temperature is set to 140° C. or more. Moreover, it is preferable that the prebaking temperature is set to the cross-linking starting temperature +30° C. or less, and is more preferable that the prebaking temperature is set to the cross-linking starting temperature +15° C. or less. That is, in a case where the cross-linking starting temperature is 140° C., it is preferable that the prebaking temperature is set to 170° C. or less, and is more preferable that the prebaking temperature is set to 155° C. or less.

Meanwhile, the prebaking temperature can be exemplified by a preset temperature of the hot plate 1, a temperature of a central portion of the surface (the upper surface in FIG. 2) of the wafer 3, or an average temperature of three points, specifically, the central portion, a circumferential portion, and an intermediate portion between the portions on the surface of the wafer 3.

In addition, when the prebaking temperature exceeds the detachment starting temperature +30° C. or the cross-linking starting temperature +30° C., the development failure caused by the so-called heat coverage in an unexposed portion cannot be ignored, however, when the prebaking temperature is set to be equal to or less than the detachment starting temperature +30° C. or to be equal to or less than the cross-linking starting temperature +30° C., the development failure can be suppressed. Especially, when the prebaking temperature is set to be equal to or less than the detachment starting temperature +15° C. or to be equal to or less than the cross-linking starting temperature +15° C., the effect for suppressing the development failure can be further improved.

Meanwhile, a length of prebaking time is, for example, 1 minute or more and 30 minutes or less.

Here, as shown in FIG. 2, in the present embodiment, since the warping of the wafer 3 in the prebaking process is downwardly-convex, the wafer is prebaked in a state where a central portion of the wafer 3 is closer to the hot plate 1 as the heat source than other portions and a circumferential portion of the wafer 3 is further from the hotplate 1 than other portions. For this reason, the central portion of the wafer 3 is prebaked at a relatively higher temperature, and the circumferential portion of the wafer 3 is prebaked at a relatively lower temperature. For this reason, closer to the central portion of the wafer 3, the sensitivity of the resist on the wafer 3 becomes relatively high, and closer to the circumferential portion of the wafer 3, the sensitivity of the resist becomes relatively low.

However, in the present embodiment, sensitivity improvement of the resist is intended on a whole surface of the wafer 3 by setting the prebaking temperature to be equal to or more than the detachment starting temperature or the cross-linking starting temperature. On this occasion, the lower the sensitivity of a portion is, the exceedingly higher the improvement of the sensitivity is, and accordingly variation of the sensitivity (Eth) of the resist on the surface of the wafer 3 can be reduced.

Next, the exposure process is carried out (step S5). Meanwhile, in the present embodiment, for example, the exposure is carried out in an even exposure amount on the whole surface of the wafer 3. In the exposure process, a hydrogen ion (acid) is generated from the PAG included in the resist by exposure energy.

Next, the post exposure bake process (step S6) is carried out. In the post exposure bake process, when the resist is the positive type, the hydrogen ion generated in the former exposure process attacks the protective group to cause the deprotection reaction, and when the resist is the negative type, the hydrogen ion acts on the cross-linker to cause the cross-linking reaction. In both cases of the positive resist and the negative resist, a hydrogen ion is newly generated in the PE process, and the new hydrogen ion causes the next deprotection reaction or cross-linking reaction.

Next, by carrying out the development process (step S7), the resist is formed in a predetermined pattern shape.

Meanwhile, in the method for manufacturing the semiconductor device according to the present embodiment, the wafer 3 is processed by using the resist pattern formed on the wafer 3 as a mask. The process of the wafer 3 is exemplified, for example, by etching to the wafer 3, ion implantation to the wafer 3, film formation on the wafer 3 (for example, formation in intervals of the resist pattern), and plasma process to the wafer 3. Here, the wafer 3 may be composed, for example, of only a semiconductor substrate, and may be formed by forming a predetermined film structure on the semiconductor substrate. In the former, the process of the wafer 3 means the process of the semiconductor substrate, and in the latter, the process of the wafer 3 means, for example, process of film on the semiconductor substrate or process of the semiconductor substrate.

In the above-mentioned first embodiment, the resist application process (step S1) for applying the resist of the positive type or the negative type on the wafer 3, the prebaking process (steps S3 and S4) for prebaking the resist, the exposure process (step S5) for exposing the resist, the post exposure bake process (step S6) for carrying out the post exposure bake to the resist, and the development process (step S7) for forming the resist in a predetermined pattern shape by developing the resist are carried out in this order. In the prebaking process (steps S3 and S4), the prebaking is carried out under a condition of temperature equal to or more than the detachment starting temperature of the protective group in the case where the resist is the positive type (step S3) and the prebaking is carried out under a condition of temperature equal to or more than the cross-linking starting temperature of the cross-linker in the case where the resist is the negative type (step S4). As described above, in the first embodiment, by using the detachment reaction (the deprotection reaction) or the cross-linking reaction at a specific temperature or more, the deprotection reaction or the cross-linking reaction, which is fundamentally promoted in the PEB process, is proceeded to some extent in the prebaking process, without the hydrogen ion generated from the PAG due to the exposure, and thus the improvement of the sensitivity of the resist is intended. On this occasion, the lower the sensitivity of the portion is, the exceedingly higher the improvement of the sensitivity is, and accordingly variation of the sensitivity (Eth) of the resist on the surface of the wafer 3 can be reduced.

That is, according to the present embodiment, since the exposure is carried out after reducing in-plane difference in sensitivity (Eth) of the resist on the wafer 3 by carrying out the prebaking at the detachment starting temperature or more or the cross-linking starting temperature or more, an in-plane variation of the pattern size attributed to the temperature unevenness in the prebaking can be suppressed.

In the present embodiment, when the prebaking temperature is set to be 140° C. to 155° C., a sensitivity improvement of the resist at the central portion of the wafer 3 is saturated, and since the temperature of the circumferential portion becomes lower than that of the central portion, the sensitivity of the circumferential portion is exceedingly improved more than that of the central portion. For this reason, the sensitivity on the surface of the wafer 3 is exceedingly and totally improved and the difference of sensitivity (Eth) between the central portion and the circumferential portion is reduced, and thus the difference of sensitivity (Eth) in one shot by the stepper also can be reduced.

Meanwhile, when the prebaking temperature is less than the detachment starting temperature or than the cross-linking starting temperature, the detachment reaction of the protective group or the cross-linking reaction of the cross-linker becomes insufficiently, and thus the above-mentioned action and effect cannot be obtained. In addition, when the prebaking temperature exceeds the detachment starting temperature +30° C. or the cross-linking starting temperature +30° C., the occurrence of the development failure caused by the so-called heat coverage in an unexposed portion cannot be ignored.

Second Embodiment

In the above-mentioned first embodiment, the example was explained in which an exposure amount on the whole surface of the base substrate (the semiconductor wafer 3) was even in the exposure process (step S3), however, in a second embodiment, an example is explained in which the exposure amount is changed depending on a position on the surface of the base substrate (the semiconductor wafer 3).

In the present embodiment, only the exposure process (step S5) is different from the above-mentioned first embodiment.

Here, as shown in FIG. 2, also in the present embodiment, since the warping in the prebaking process is downwardly-convex, the prebaking is carried out in a state where a central portion of the wafer 3 is closer to the hot plate 1 than other portions and a circumferential portion of the wafer 3 is further from the hotplate 1 than other portions. For this reason, the central portion of the wafer 3 is prebaked at relatively higher temperature, and the circumferential portion of the wafer 3 is prebaked at a relatively lower temperature. For this reason, closer to the central portion, the sensitivity of the resist becomes relatively higher, and closer to the circumferential portion, the sensitivity becomes relatively lower.

Then, in the present embodiment, as shown in FIG. 3 for example, in the exposure process, the exposure amount is gradually changed, so that closer to the central portion of the wafer 3, the exposure amount becomes small and that closer to the circumferential portion of the wafer 3, the exposure amount becomes large. In other words, the exposure is carried out so that the exposure amount on a portion having higher sensitivity becomes smaller and that the exposure amount on a portion having lower sensitivity becomes larger. Further in other words, the exposure is carried out so that the exposure amount on a portion prebaked with a higher temperature becomes smaller and that the exposure amount on a portion prebaked with lower temperature becomes larger. Further in other words, the exposure is carried out so that the exposure amount on a portion closer to the heat source (the hot plate 1) in the prebaking becomes smaller and that the exposure amount on a portion further from the heat source in the prebaking becomes larger.

Meanwhile, in FIG. 3, one example of an amount (a unit; $mJ/cm^2$) of an exposure energy irradiated to each region on the surface of the wafer 3 is shown. That is, in FIG. 3, the exposure energy is changed in each exposure range R showing one shot by the stepper (not shown in the drawing), and the exposure energy is changed so that closer to the central portion (having higher sensitivity), the exposure amount becomes small and that closer to the circumferential portion (having lower sensitivity), the exposure amount becomes large.

Figure 4:
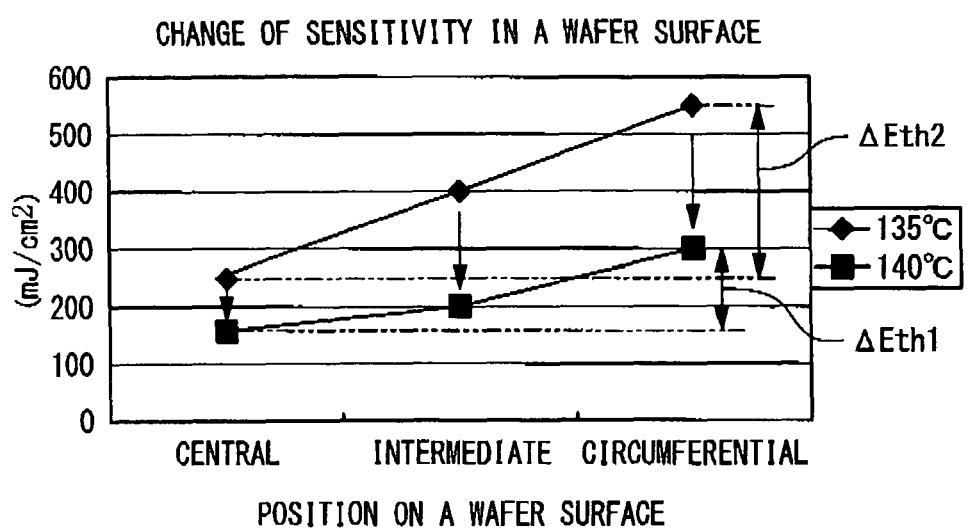
FIG. 4 is a drawing showing change of sensitivity (Eth) of a resist in the surface of the wafer in a case where temperature in the prebaking process is changed from 135° C. to 140° C.

FIG. 4 is a drawing showing a change of the sensitivity (Eth) of the resist on the surface of the wafer 3 where the prebaking temperature in the prebaking process is changed from 135° C. to 140° C., in a case of using a positive resist whose detachment starting temperature is 140° C. and in a case of carrying out the prebaking process in a state where the wafer 3 is warped to be downwardly-convex as shown in FIG. 2.

As described above, when the prebaking process is carried out at the detachment starting temperature or more, the sensitivity of the resist can be improved compared to a case where the prebaking temperature is low (for example, 135° C. and so on). Furthermore, as shown in FIG. 1, an improvement amount of the sensitivity becomes large at a portion in which the sensitivity becomes relatively low (the circumferential portion in the present embodiment) compared to a case where the prebaking temperature is low (for example, 135° C. and so on). Accordingly, the in-plane sensitivity difference of the resist can be reduced.

Specifically, as shown in FIG. 4 for example, in a case where the prebaking temperature is 135° C., the in-plane sensitivity difference ($\Delta Eth2$ in FIG. 4) of the resist is approximately 300 $mJ/cm^2$, however, when the prebaking temperature is set to be 140° C., the in-plane sensitivity difference ($\Delta Eth1$ in FIG. 4) can be suppressed to be approximately 150 $mJ/cm^2$.

In this manner, in the present embodiment, a variable exposure, in which the exposure amount by the stepper is increased toward the circumferential portion from the central portion depending on the difference of the sensitivity, is combined to be added to the suppression of the in-plane variation in the pattern sizes by suppressing the in-plane difference of the sensitivity. That is, the exposure is carried out so that the exposure amount of a portion having higher sensitivity becomes smaller and that the exposure amount of the portion having lower sensitivity becomes larger. In this manner, the in-plane variation in the pattern size can be reduced more than that of the above-mentioned first embodiment.

Meanwhile, since the exposure amount is even in a range exposed in one shot in the techniques described in documents 1 and 2, the pattern size of the resist varies in the wafer surface due to the temperature unevenness. Meanwhile, in the present embodiment, since the sensitivity difference of the resist can be reduced by the prebaking at the detachment starting temperature or more or the cross-linking starting temperature or more, the variation in pattern-sizes of the resist in the prebaking process can be suppressed to be even in the range exposed in one shot.

Additionally, in the techniques described in documents 1 and 2, since the exposure amount drastically changes on a boundary between one range exposed in one shot and the other range adjacent to the range, the size of the resist pattern also drastically changes on the boundary. On the other hand, in the present embodiment, the prebaking is carried out at the detachment starting temperature or more or the cross-linking starting temperature or more to totally raise a level of the sensitivity of the resist, and consequently the sensitivity difference of the resist can be reduced. Accordingly, in the present embodiment, since the exposure energy can be reduced over the whole surface, a change amount of the exposure amount on the boundary can be also reduced. Accordingly, the change amount of the size of the resist pattern on the boundary can be also reduced.

Third Embodiment

In the above-mentioned second embodiment, the case where the warping is downwardly-convex was explained; however, in a third embodiment, a case where the warping is upwardly-convex will be explained.

In the case of the third embodiment, the sensitivity of the resist at the central portion and the circumferential portion of the wafer 3 (or the prebaking temperatures at the central portion and the circumferential portion of the wafer 3, or the distances from the heat source in the prebaking at the central portion and the circumferential portion of the wafer 3) is reversed compared to the case of the above-mentioned second embodiment. That is, the sensitivity of the resist at the central portion is low, and closer to the circumference, the sensitivity becomes higher. In addition, the prebaking temperature at the central portion is lower, and the prebaking temperature at the circumference portion becomes higher. In addition, a distance from the heat source (the hot plate 1) in the prebaking is longer at the central portion, and is shorter at the circumference portion.

Then, in the third embodiment, contrary to the above-mentioned second embodiment, closer to the central portion of the wafer 3, the exposure amount in the exposure process becomes larger, and closer to the circumferential portion, the exposure amount becomes smaller. In this manner, also in the third embodiment, the same action and effect as those of the above-mentioned second embodiment can be obtained.

What is claimed is:

1. A method for forming a resist pattern, the method comprising:
    applying a chemically-amplified resist layer of a positive type or a negative type on a base substrate;
    prebaking said resist layer after said applying;
    exposing said resist layer after said prebaking;
    baking said resist layer after said exposing; and
    patterning said resist layer to have a predetermined shape by developing said resist layer after said baking,
    wherein said prebaking comprises:
        prebaking at a temperature equal to or more than a detachment starting temperature of a protective group of a base resin included in said resist layer, when said resist layer is of the positive type; and
        prebaking at a temperature equal to or more than a cross-linking starting temperature of a cross-linker of a base resin included in said resist layer, when said resist layer is of the negative type.

2. The method for forming a resist pattern according to claim 1, wherein, when the resist layer is of the positive type, the temperature equal to or more than the detachment starting temperature is equal to or less than the detachment starting temperature plus 30° C.

3. The method for forming a resist pattern according to claim 1, wherein, when the resist layer is of the negative type, the temperature equal to or less than the cross-linking starting temperature is equal to or less than the cross-linking starting temperature plus 30° C.

4. The method for forming a resist pattern according to claim 1, wherein the resist layer comprises a first portion and a second portion, the first portion having a sensitivity that is greater than a sensitivity of the second portion, and
    wherein said exposing comprises exposing said resist layer such that an, exposure amount on the first portion is less than an exposure amount on the second portion.

5. The method for forming a resist pattern according to claim 1, wherein the resist layer comprises a first portion and a second portion, the first portion being prebaked at a temperature that is greater than a temperature at which the second portion is prebaked, and
    wherein said exposing comprises exposing said resist layer such that an exposure amount on the first portion is less than an exposure amount on the second portion.

6. The method for forming a resist pattern according to claim 1, wherein the resist layer comprises a first portion and a second portion, the first portion being closer to a heat source in said prebaking than the second portion, and
    wherein said exposing comprises exposing said resist layer such that an exposure amount on the first portion is less than an exposure amount on the second portion.

7. The method for forming a resist pattern according to claim 1, wherein, when the resist layer is of the positive type, the temperature equal to or more than the detachment starting temperature is equal to or less than the detachment starting temperature plus 15° C.

8. The method for forming a resist pattern according to claim 1, wherein, when the resist layer is of the negative type, the temperature equal to or less than the cross-linking starting temperature is equal to or less than the cross-linking starting temperature plus 15° C.

9. The method for forming a resist pattern according to claim 1, wherein the prebaking is performed for 1 minute or more and 30 minutes or less.

10. The method for forming a resist pattern according to claim 1, wherein the exposing generates a hydrogen ion.

11. The method for forming a resist pattern according to claim 10, wherein, when the resist layer is of the positive type, the hydrogen ion reacts with the protective group of the base resin included in the resist layer.

12. The method for forming a resist pattern according to claim 11, wherein the reaction of the hydrogen ion with the protective group occurs during the baking.

13. The method for forming a resist pattern according to claim 11, wherein the reaction of the hydrogen ion with the protective group comprises a deprotection reaction.

14. The method for forming a resist pattern according to claim 10, wherein, when the resist layer is of the negative type, the hydrogen ion reacts with the cross-linker of the base resin included in the resist layer.

15. The method for forming a resist pattern according to claim 14, wherein the reaction of the hydrogen ion with the cross-linker occurs during the baking.

16. The method for forming a resist pattern according to claim 14, wherein the reaction of the hydrogen ion with the cross-linker comprises a cross-linking reaction.

17. The method for forming a resist pattern according to claim 10, wherein the hydrogen ion reacts with the resist layer in the baking.

18. The method for forming a resist pattern according to claim 17, wherein the reaction of the hydrogen ion with the resist layer comprises:
    a deprotection reaction, when the resist layer is of the positive type; and
    a cross-linking reaction, when the resist layer is of the negative type.

19. The method for forming a resist pattern according to claim 17, wherein the baking generates another hydrogen ion, the another hydrogen ion reacting with the resist layer.

20. A method for manufacturing a semiconductor device, the method comprising:
    forming a resist pattern on a semiconductor wafer; and
    shaping said semiconductor wafer by using said resist pattern as a mask,
    wherein said forming includes a method for forming a resist pattern, and said method for forming the resist pattern comprises:
        applying a chemically-amplified resist layer of a positive type or a negative type on a base substrate;
        prebaking said resist layer after said applying;
        exposing said resist layer after said prebaking;
        baking said resist layer after said exposing; and forming said resist layer to be a predetermined shape by developing said resist after said baking, and wherein said prebaking comprises:

prebaking at a temperature equal to or more than a detachment starting temperature of a protective group of a base resin included in said resist layer, when said resist layer is of the positive type; and prebaking at a temperature equal to or more than a cross-linking starting temperature of a cross-linker of a base resin included in said resist layer, when said resist layer is of the negative type.

* * * * *